(12) United States Patent
Um et al.

(10) Patent No.: US 8,842,474 B2
(45) Date of Patent: Sep. 23, 2014

(54) NONVOLATILE MEMORY DEVICE AND NONVOLATILE MEMORY SYSTEM INCLUDING THE SAME

(71) Applicant: SK hynix Inc., Gyeonggi-do (KR)

(72) Inventors: Gi-Pyo Um, Gyeonggi-do (KR); Sang-Sik Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 9 days.

(21) Appl. No.: 13/799,328

(22) Filed: Mar. 13, 2013

(65) Prior Publication Data
US 2014/0056073 A1 Feb. 27, 2014

(30) Foreign Application Priority Data

Aug. 23, 2012 (KR) .................. 10-2012-0092290

(51) Int. Cl.
G11C 16/04 (2006.01)
G11C 16/26 (2006.01)
(52) U.S. Cl.
CPC ..................................... G11C 16/26 (2013.01)
USPC ................. 365/185.12; 365/185.18

(58) Field of Classification Search
USPC .................... 365/185.12, 185.18, 185.29
See application file for complete search history.

(56) References Cited

U.S. PATENT DOCUMENTS 8,284,609 B2 * 10/2012 Mokhlesi et al. ........ 365/185.19
8,315,092 B2 * 11/2012 Strasser et al. ........... 365/185.03

FOREIGN PATENT DOCUMENTS

| KR | 101998055941 | 9/1998 |
| KR | 1020060021471 | 3/2006 |
| KR | 1020100076738 | 7/2010 |
| KR | 1020100107268 | 10/2010 |

* cited by examiner

Primary Examiner — Huan Hoang
(74) Attorney, Agent, or Firm — IP & T Group LLP

(57) ABSTRACT

A nonvolatile memory device includes a cell array including a plurality of pages, a selection unit configured to select one of the pages in response to a page selection address, an operation control unit configured to read data of a given number of pages adjacent to the selected page and output the read data as backup data, to erase data of the selected page, in response to a page erase command, and to reprogram update data and the backup data in the selected page and the adjacent pages, respectively, and a data storage unit configured to store the backup data.

25 Claims, 5 Drawing Sheets

NONVOLATILE MEMORY DEVICE AND NONVOLATILE MEMORY SYSTEM INCLUDING THE SAME

CROSS-REFERENCE TO RELATED APPLICATIONS

The present application claims priority of Korean Patent Application No. 10-2012-0092290, filed on Aug. 23, 2012, which is incorporated herein by reference in its entirety.

BACKGROUND

1. Field

Exemplary embodiments of the present invention relate to a semiconductor design technology, and more particularly, to a nonvolatile memory device capable of performing an erase operation in units of pages, and a nonvolatile memory system including the nonvolatile memory device.

2. Description of the Related Art

In general, a NAND type flash memory device includes a plurality of cell blocks. One cell block (also called a "sector") includes a plurality of cell strings in which a plurality of cells are serially connected to one another, a plurality of bit lines, a plurality of word lines, drain selection transistors connected between the cell strings and the bit lines, and source selection transistors connected between the cell strings and common source lines.

Meanwhile, a plurality of memory cells sharing one word line constitute one or more pages, and all cells share a P well. Furthermore, the NAND type flash memory device further includes pass transistors for supplying a given voltage to the cell block, where the pass transistors include a drain selection transistor of a high voltage transistor, a source selection transistor of a high voltage transistor, and a cell selection transistor of a high voltage transistor.

The NAND type flash memory device configured as above performs an erase operation prior to a program operation, in which data is programmed in a selected cell. The program operation of the NAND type flash memory device is performed in units of pages, but the erase operation is performed in units of cell blocks because all the cells share the P well. An erase operation of the conventional NAND type flash memory device will be briefly described below.

One of the cell blocks is selected, and then a power supply voltage is supplied to gates of the drain selection transistor, the source selection transistor, and the cell selection transistor within the pass transistor coupled to the selected cell block. Next, a voltage of 4.5 V is supplied to the drain selection transistor and the source selection transistor, and a voltage of 0 V is supplied to a memory cell through the cell selection transistor. On the other hand, a voltage of 0 V is supplied to the gate of the drain selection transistor, the source selection transistor, and the cell selection transistor coupled to an unselected cell block. Then, an erase voltage is supplied to P wells of all the cell blocks. However, when the P well of the unselected cell is increased by the erase voltage, a word fine voltage of the unselected cell is increased by a coupling effect due to capacitance of a word line and capacitance between the word line and the P well, and thus, the unselected cell block may not be erased.

The conventional NAND type flash memory device, in which the erase operation is performed in units of cell blocks as described above, has a limitation in updating data. In other words, to correct a part of the data, it may be necessary to perform a process of writing data for all cells within one cell block to correct a part of the data. That is, in the case in which 64 or 128 pages typically constitute one cell block, it is necessary to perform erase operations to the 64 or 128 pages and additional moving operations corresponding data to another cell block in order to correct a part of the data.

Therefore, if an erasable unit is subdivided into a unit other than a block unit, it may be possible to ensure the use expandability of the NAND type flash memory device.

SUMMARY

Exemplary embodiments of the present invention are directed to a nonvolatile memory device which supports an erase operation in units of pages.

Particularly, an embodiment of the present invention is directed to a nonvolatile memory device capable of supporting an erase operation in units of pages and substantially preventing interference from occurring in a page adjacent to a page to be erased.

In accordance with an embodiment of the present invention, a nonvolatile memory device includes a cell array including a plurality of pages, a selection unit configured to select one of the pages in response to a page selection address, an operation control unit configured to read data of a given number of pages adjacent to the selected page and output the read data as backup data, to erase data of the selected page, in response to a page erase command, and to reprogram update data and the backup data in the selected page and the adjacent pages, respectively, and a data storage unit configured to store the backup data.

In accordance with another embodiment of the present invention, a nonvolatile memory device includes cell array including a plurality of word lines, each constituting a given number of pages, a selection unit configured to select one of the word lines, which includes a page selected in response to a page selection address, an operation control unit configured to read data of a given number of word lines adjacent to the selected word line and output the read data as backup data, to erase data of the selected word line, in response to a page erase command, and to reprogram update data and the backup data in the selected word line and the adjacent word lines, respectively, and a data storage unit configured to store the backup data.

In accordance with yet another embodiment of the present invention, a nonvolatile memory system includes, a nonvolatile memory device configured to support an erase operation in units of pages, to output data of a given number of pages adjacent to a selected page to be erased as backup data in response to a page erase command, to perform the erase operation for the selected page, and to reprogram update data and the backup data in the selected page and the adjacent pages, respectively, and an auxiliary memory device configured to store the backup data.

In accordance with still another embodiment of the present invention, a method of driving nonvolatile memory device includes reading data of a given number of pages adjacent to a selected page, storing the read data in a data storage unit as backup data, performing an erase operation for the selected page, and performing an reprogram operation on the adjacent pages with the backup data.

The aforementioned exemplary embodiments of the present invention allow the erase operation to be performed in units of pages as well as in units of blocks, thereby significantly increasing the use expandability of the nonvolatile memory device.

Furthermore, when the erase operation is performed in the nonvolatile memory device in units of pages, data of a page adjacent to a page to be erased may be stored in a separate storage space and the stored page data may be reprogrammed later. Thus, it may be possible to prevent interference from occurring in the page adjacent to the page to be erased, and to improve the performance of the nonvolatile memory device.

DETAILED DESCRIPTION

Figure 1:
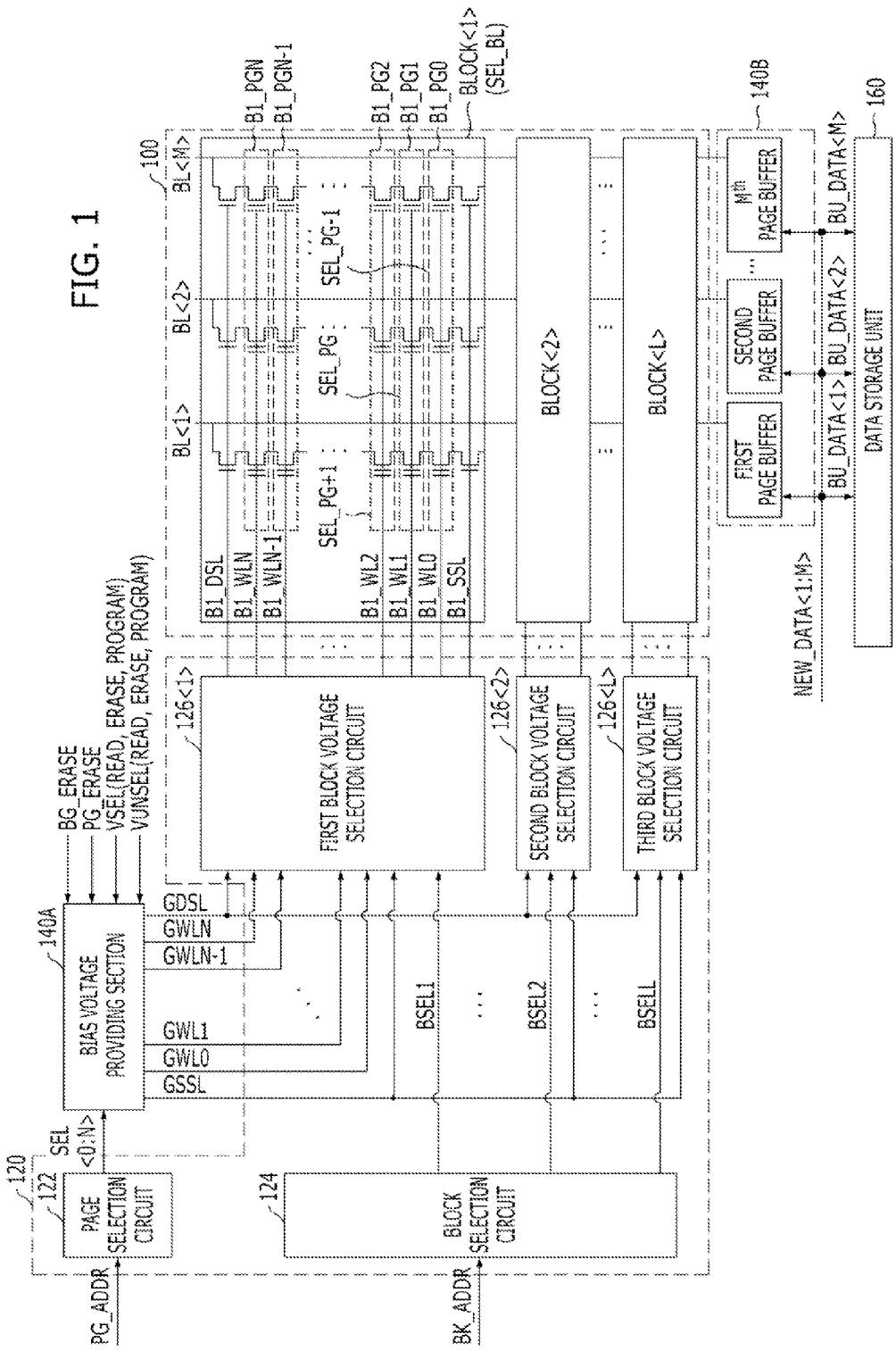
FIG. 1 is a block diagram illustrating a nonvolatile memory device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a nonvolatile memory device in accordance with a first embodiment of the present invention.

Referring to FIG. 1, the nonvolatile memory device in accordance with the first embodiment of the present invention includes a cell array 100 including a plurality of pages B<1:L>_PG<0:N> a selection unit 120, an operation control unit 140A and 140B, and a data storage unit 160.

The selection unit 120 is configured to select one page of the plurality of pages B<1:L>_PG<0:N> in response to a page selection address PG_ADDR. Hereinafter, the page selected by the selection unit 120 is referred to as a selected page SEL_PG, and it is assumed that a first page B1_PG1 of a first cell block BLOCK<1> is selected in the first embodiment of the present invention. The operation control unit 140A and 140B is configured to read data of a given number of pages SEL_PG+1 and adjacent to the selected page SEL_PG in response to a page erase command PG_ERASE, to output the read data as backup data BU_DATA<1:M>, to erase data of the selected page SEL_PG, and to reprogram update data NEW_DATA<1:M> and the backup data BU_DATA<1:M> in the selected page SEL_PG and the adjacent pages SEL_PG+1 and SEL_PG−1 respectively. In this case, the adjacent pages SEL_PG+1 and SEL_PG−1 indicate a $0^{th}$ page B1_PG0 and a second page B1_PG2 of the first cell block BLOCK<1>, because it is assumed that the first page B1_PG1 of the first cell block BLOCK<1> is selected in the first embodiment of the present invention. The data storage unit 150 is configured to store the backup data BU_DATA<1:M>.

The operation control unit 140A and 140B of the first embodiment of the present invention sets two pages located at both sides of the selected page SEL_PG selected by the selection unit 120 to the adjacent pages SEL_PG+1 and SEL_PG−1. However, this is for illustrative purposes only. For example, it may be possible to set two or more adjacent pages located at both sides of the selected page SEL_PG selected by the selection unit 120 to the given number of adjacent pages according to the selection of a designer.

The operation control unit 140A and 140B includes a bias voltage providing section 140A and page buffering section 140B. The bias voltage providing section 140A is configured to sequentially supply an erase bias voltage VSEL<ERASE> and a program bias voltage VSEL<PROGRAM> to a word line, i.e., B1_WL1, corresponding to the selected page SEL_PG, and to sequentially supply a read bias voltage VSEL<READ> and the program bias voltage VSEL<PROGRAM> to a given number of word lines, i.e., B1_WL0 and B1_WL2, corresponding to the adjacent pages SEL_PG+1 and SEL_PG−1 in response to the page erase command PG_ERASE. The page buffering section 140B includes a plurality of page buffers <1:M>. The page buffering section 140B is configured to read data in a period, in which the read bias voltage VSEL<READ> is supplied to the adjacent pages SEL_PG+1 and SEL_PG−1, in units of pages, to output the read data as the backup data BU_DATA<1:M> and to receive and program the update data NEW_DATA<1:M> and the backup data BU_DATA<1:M> in units of pages in a period in which the program bias voltage VSEL<PROGRAM> is provided to the selected page SEL_PG and the adjacent pages SEL_PG+1 and SEL_PG−1.

The bias voltage providing section 140A is configured to supply the read bias voltage VSEL<READ> to the word lines B1_WL0 and B1_WL2 corresponding to the adjacent pages SEL_PG−1 and SEL_PG−1 at iron-overlapping time points, to supply the erase bias voltage VSEL<ERASE> to the word line B1_WL1 corresponding to the selected page SEL_PG, and to supply the program bias voltage VSEL<PROGRAM> to the word fine B1_WL1 corresponding to the selected page SEL_PG and the word lines B1_WL0 and B1_WL2 corresponding to the adjacent pages SEL_PG+1 and SEL_PG−1 at non-overlapping time points.

The page buffering section 140B is configured to read data, which are stored in the adjacent pages SEL_PG+1 and SEL_PG−1 whenever the read bias voltage VSEL<READ> is supplied to the word lines B1_WL0 and B1_WL2 corresponding to the adjacent pages SEL_PG+1 and SEL_PG−1, to output the read data as the backup data BU_DATA<1:M>, to receive the update data NEW_DATA<1:M> and the backup data BU_DATA<1:M> in units of pages whenever the program bias voltage VSEL<PROGRAM> is supplied to the word line B1_WL1 corresponding to the selected page SEL_PG and the word lines B1_WL0 and B1_WL2 corresponding to the adjacent pages SEL_PG+1 and SEL_PG−1, and to program the received data in the pages SEL_PG+1, SEL_PG, and SEL_PG−1. At this time, the update data NEW_ DATA<1:M> is programmed in the selected page SEL_PG, and the backup data BU_DATA<1:M> are stored in the adjacent pages SEL_PG+1 and SEL_PG−1.

The update data NEW_DATA<1:M> is to be newly programmed in the selected page SEL_PG, and is input from an exterior.

In order for the operation control unit 140A and 140B to program the update data NEW_DATA<1:M> and the backup data BU_DATA<1:M>, it is possible to use various schemes well-known in the art. For example, it is possible to program the update data NEW_DATA<1:M> and the backup data BU_DATA<1:M> in the pages SEL_PG+1, SEL_PG, and SEL_PG−1 using an incremental pulse programming (ISPP) scheme.

In the first embodiment of the present invention described above, since only the selected page SEL_PG is erased and the adjacent pages SEL_PG+1 and SEL_PG−1 are not erased, the operation control unit 140A and 140B may operate in such a manner that the selected page SEL_PG stores the update data NEW_DATA<1:M> through a normal program operation (Normal Program), and the adjacent pages SEL_PG+1 and SEL_PG−1 store the backup data BU_DATA<1:M> through a reprogram operation (Re-Program), which is simpler than the normal program operation.

Since the program operation, the normal program operation, and the reprogram operation of the incremental pulse programming (ISPP) scheme are well-known, a detailed description thereof will be omitted.

Among the plurality of pages B<1:L>_PG<0:N>, a given number of pages Bx_PG<0:N> are grouped into one cell block BLOCK<x>, so that it is possible for the cell array 100 to include a plurality of cell blocks BLOCK<1:L>.

In the configuration in which the plurality of cell blocks BLOCK<1:L> are included in the cell array 100 and the given number of pages Bx_PG<0:N> are included in each cell block as described above, the selection unit 120 selects one cell block SEL_BL of the plurality of cell blocks BLOCK<1:L> in response to a block selection address BK_ADDR, thereby simultaneously selecting a given number of pages B1_PG<0:N> included in the selected cell block SEL_BL, wherein the selection unit 120 may select one cell block by operating in such a manner that one signal of BSEL<1:L> is activated and remaining signals are deactivated, and it is assumed that the first cell block BLOCK<1> is selected in the first embodiment of the present invention.

In this way, when the given number of pages B1_PG<0:N> included in the selected cell block SEL_BL are simultaneously selected from the plurality of cell blocks BLOCK<1:L> in response to the block selection address BK_ADDR, the operation control unit 140A and 140B reads data of pages B1_PG<0> and B1_PG<2:N>, except for data of a page SEL_PG selected from the given number of pages B1_PG<0:N> included in the selected cell block SEL_BL, in response to a block erase command BG_ERASE, outputs the read data as the backup data BU_DATA<1:M>, simultaneously erases the given number of pages B1_PG<0:N> included in the selected cell block SEL_BL and reprograms the update data NEW_DATA<1:M> and the backup data BU_DATA<1:M> in the given number of pages B1_PG<0:N> included in the selected cell block SEL_BL. At this time, the backup data BU_DATA<1:M> is programmed in the pages B1_PG<0> and B1_PG<2:N> except for the selected page SEL_PG to be erased by a user from the given number of pages B1_PG<0:N> included in the selected cell block SEL_BL, and the update data NEW_DATA<1:M> is programmed in the selected page SEL_PG selected to be erased by a user from the given number of pages B1_PG<0:N> included in the selected cell block SEL_BL.

Accordingly, the bias voltage providing section 140A supplies the read bias voltage VSEL<READ> to the word lines B1_WL0 and B1_WL<2:N> except for the word line B1_WL1 corresponding to the selected page SEL_PG among the word lines B1_WL<0:N> corresponding to the given number of pages B1_PG<0:N> included in the selected cell block SEL_BL, at non-overlapping time points, simultaneously supplies the erase bias voltage VSEL<ERASE> to the word lines B1_WL<0:N> corresponding to the given number of pages B1_PG<0:N> included in the selected cell block SEL_BL, and supplies the program bias voltage VSEL<PROGRAM> to the word lines B1_WL<0:N>, which corresponds to the given number of pages B1_PG<0:N> included in the selected cell block SEL_BL, at non-overlapping time points.

Furthermore, the page buffering section 140B reads data, which are stored in the pages B1_PG<0> and B1_PG<2:N>, except for the selected page SEL_PG among the given number of pages B1_PG<0:N> included in the selected cell block SEL_BL, in units of pages whenever the read bias voltage VSEL<READ> is supplied to the word lines B1_WL0 and B1_WL<2:N>, except for the word line B1_WL1 corresponding to the selected page SEL_PG among the word lines B1_WL<0:N> corresponding to the given number of pages B1_PG<0:N> included in the selected cell block SEL_BL, outputs the read data as the backup data BU_DATA<1:M>, receives the update data NEW_DATA<1:M> and the backup data BU_DATA<1:M> in units of pages whenever the program bias voltage VSEL<PROGRAM> is supplied to the word lines B1_WL<0:N> corresponding to the given number of pages B1_PG<0:N> included in the selected cell block SEL_BL, and programs the received data in the given number of pages B1_PG<0:N> included in the selected cell block SEL_BL.

Although a detailed configuration of the data storage unit 160 is not directly illustrated, when the selection unit 120 selects one page, it is possible to store, in units of pages, the data of the adjacent pages SEL_PG+1 and SEL_PG−1. When the selection unit 120 selects one block, the data storage unit 160 includes a plurality of registers (not directly illustrated in FIG. 1) capable of storing, in units of pages, the data of the pages B1_PG<0> and B1_PG<2:N> except for the selected page SEL_PG among the given number of pages B1_PG<0:N> included in the selected cell block SEL_BL.

Furthermore, the data storage unit 160 may have the plurality of registers as described above, but the data storage unit 160 may have a plurality of latches (not illustrated in FIG. 1) capable of temporarily storing data through a logical circuit configuration, or may store the data in a given space (not illustrated in FIG. 1) of the cell array 100. At this time, since the given space of the cell array 100 generally indicates a space in which direct access is limited by a user, and a configuration of the nonvolatile memory device including the given space is well-known in the art, a detailed description thereof will be omitted.

Figure 2:
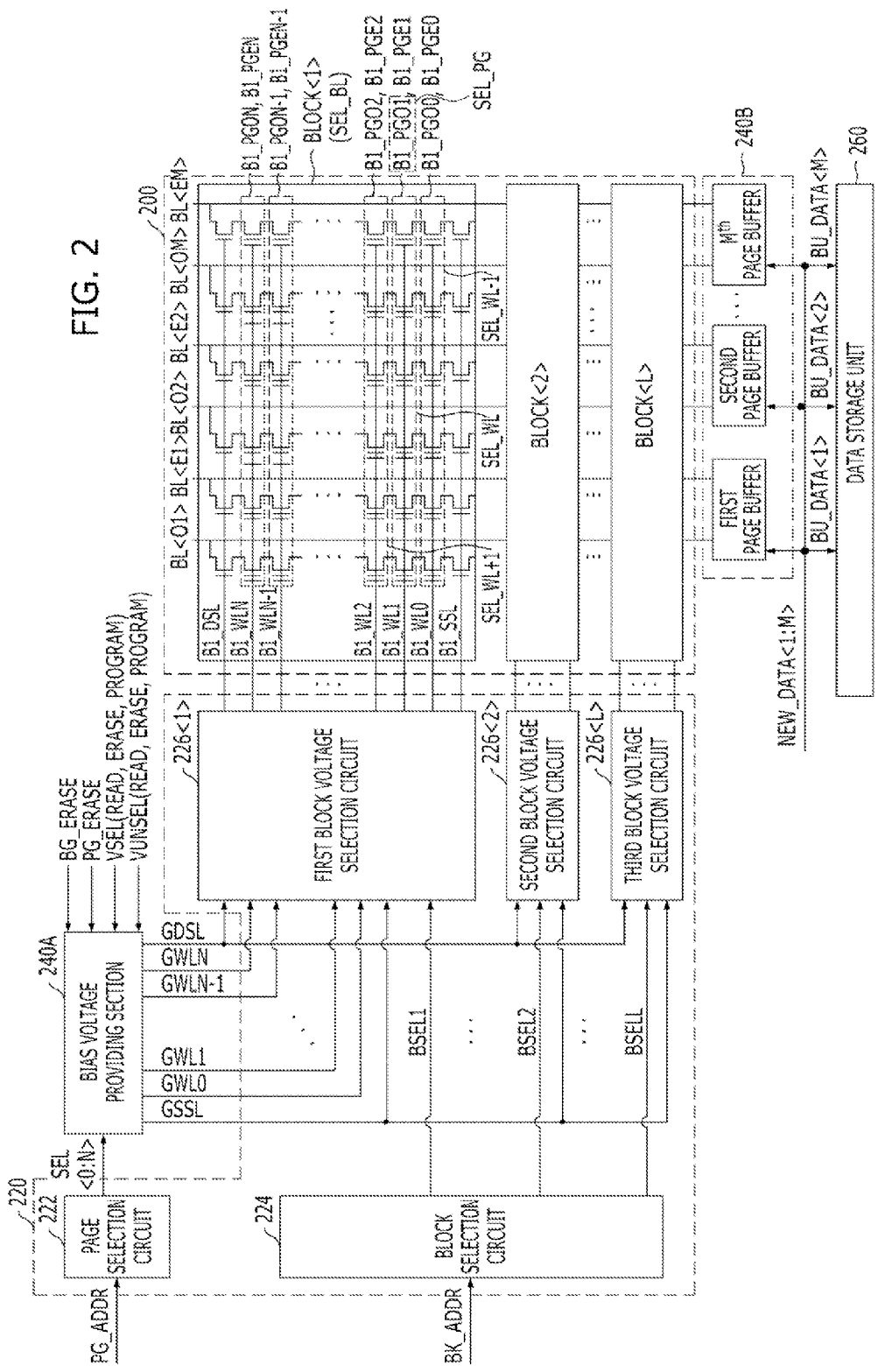
FIG. 2 is a block diagram illustrating a nonvolatile memory device in accordance with a second embodiment of the present invention.

FIG. 2 is a block diagram illustrating a nonvolatile memory device in accordance with a second embodiment of the present invention.

First, since the nonvolatile memory device in accordance with the first embodiment of the present invention has a configuration in which a plurality of word lines B<1:L>_WL<0:N> are matched with a plurality of pages B<1:L>_PG<0:N> in a one-to-one manner, an operation in units of pages may be an operation in units of word lines. That is, in the operation in units of pages, the adjacent pages SEL_PG+1 and SEL_PG−1 are the given number of physically adjacent pages SEL_PG+1 and SEL_PG−1.

However, the nonvolatile memory device in accordance with the second embodiment of the present invention has a configuration in which a plurality of word lines B<1:L>_WL<0:N> are not matched with plurality of pages B<1:L>_PGO<0:N> and pages B<1:L>_PGE<0:N> in a one-to-one manner. Accordingly, when the operation in units of pages is performed, a given number of pages SEL_PG+1 and SEL_PG−1 correspond to a given number of physically adjacent word lines SEL_WL−1 and SEL_WL+1 on the basis of a selected word line SEL_WL including the selected page SEL_PG.

In detail, referring to FIG. 2, the nonvolatile memory device in accordance with the second embodiment of the present invention includes a cell array 200 including a plurality of pages B<1:L>_PGO<0:N> and B<1:L>_PGE<0:N>, a selection unit 220, an operation control unit 240A and 240B, and a data storage unit 260. The selection unit 220 is configured to select one of a plurality of word lines B<1:L>_WL<0:N> in response to a page selection address PG_ADDR. Hereinafter, the word line selected by the selection unit 220 is referred to as a selected word line SEL_WL, and the selected word line SEL_WL becomes a first word line B1_WL1 of the first cell block BLOCK<1>, because it is assumed that a first odd-numbered page B1_PGO1 of the first cell block BLOCK<1> is selected as a selected page buffer SEL_PG in accordance with the second embodiment of the present invention. The operation control unit 240A and 240B is configured to read data of a given number of word lines SEL_WL−1 and SEL_WL+1 which are adjacent to the selected word line SEL_WL, in response to a page erase command PG_ERASE, to output the read data as backup data BU_DATA<1:M>, to erase data of the selected word line SEL_WL, and to reprogram update data NEW_DATA<1:M> and the backup data BU_DATA<1:M> in the selected word line SEL_WL and the adjacent word lines SEL_WL−1 and SEL_WL+1, respectively. In this case, the adjacent word lines SEL_WL−1 and SEL_WL+1 indicate a $0^{th}$ word line B1_WL0 and a second word line B1_WL2 of the first cell block BLOCK<1>, because it is assumed that the first odd-numbered page B1_PGO1 of the first cell block BLOCK<1> included in the first word line B1_WL1 of the first cell block BLOCK<1> is selected in the second embodiment of the present invention. The data storage unit 260 is configured to store the backup data BU_DATA<1:M>.

The operation control unit 240A and 240B of the second embodiment of the present invention sets two word lines located in both side of the selected word line SEL_WL selected by the selection unit 220 to the adjacent word lines SEL_WL−1 and SEL_WL+1. However, this is for illustrative purposes only. For example, it may be possible to set two or more adjacent word lines located in both side of the selected word line SEL_WL selected by the selection unit 220 to the given number of adjacent word lines according to the selection of a designer.

In the second embodiment of the present invention, one word line includes two pages, those are an odd page and an even page. However, this is for illustrative purposes only. That is, the embodiment of the present invention may be applied to a case in which one word line includes two or more pages. For example, the embodiment of the present invention may be applied to a case in which each cell included in the cell array 200 serves as a multi-level cell (MLC) or a triple-level cell (TLC) and one word line includes two or more pages.

The operation control unit 240A and 240B includes a bias voltage providing section 240A and page buffering section 240B. The bias voltage providing section 240A is configured to sequentially supply an erase bias voltage VSEL<ERASE> and a program bias voltage VSEL<PROGRAM> to the selected word line SEL_WL in response to the page erase command PG_ERASE, and to sequentially supply a read bias voltage VSEL<READ> and the program bias voltage VSEL<PROGRAM> to the adjacent word lines SEL_WL−1 and SEL_WL+1. The page buffering section 240B includes a plurality of page buffers <1:M>. The page buffering section 240B is configured to read data in units of pages in a period in which the read bias voltage VSEL<READ> is provided to a given number of pages SEL_PGO−1, SEL_PGE−1, SEL_PGO+1, and SEL_PGE+1 included in the adjacent word lines SEL_WL−1 and SEL_WL+1, to output the read data as the backup data BU_DATA<1:M>, and to receive and program the update data NEW_DATA<1:M> and the backup data BU_DATA<1:M> in units of pages in a period in which the program bias voltage VSEL<PROGRAM> is provided to the selected word line SEL_WL and a given number of pages SEL_PGO−1, SEL_PGE−1, SEL_PGO, SEL_PGE, SEL_PGO+1, and SEL_PGE+1 included in the adjacent word lines SEL_WL−1 and SEL_WL+1.

The bias voltage providing section 240A is configured to supply the read bias voltage VSEL<READ> to the adjacent word lines SEL_WL−1 and SEL_WL+1 at non-overlapping time points, to supply the erase bias voltage VSEL<ERASE> to the selected word line SEL_WL, and to supply the program bias voltage VSEL<PROGRAM> to the selected word line SEL_WL and the adjacent word lines SEL_WL−1 and SEL_WL+1 at non-overlapping time points.

The page buffering section 240B is configured to read data, which are stored in the given number of pages SEL_PGO−1, SEL_PGE−1, SEL_PGO+1 and SEL_PGE+1 included in the word lines SEL_WL−1 and SEL_WL+1 whenever the read bias voltage VSEL<READ> is supplied to the adjacent word lines SEL_WL−1 and SEL_WL+1 to output the read data as the backup data BU_DATA<1:M>, to receive the update data NEW_DATA<1:M> and the backup data BU_DATA<1:M> in units of pages whenever the program bias voltage VSEL<PROGRAM> is supplied to the selected word line SEL_WL and the adjacent word lines SEL_WL−1 and SEL_WL+1, and to program the received data in the pages SEL_PGO−1, SEL_PGE−1, SEL_PGO, SEL_PGE, SEL_PGO+1, and SEL_PGE+1 included in the word lines SEL_WL−1, SEL_WL, and SEL_WL+1.

The update data NEW_DATA<1:M> is to be newly programmed in the selected word line SEL_WL, and is input from an exterior in units of pages.

In order for the operation control unit 240A and 240B to program the update data NEW_DATA<1:M> and the backup data BU_DATA<1:M> it is possible to use various schemes well-known in the art. For example, it is possible to program the update data NEW_DATA<1:M> and the backup data BU_DATA<1:M> in the given number of pages SEL_PGO−1, SEL_PGE−1, SEL_PGO, SEL_PGE, SEL_PGO+1, and SEL_PGE+1, which are included in the word lines SEL_WL−1, SEL_WL, and SEL_WL+1, using an incremental pulse programming (ISPP) scheme.

In the second embodiment of the present invention described above, since only the selected word line SEL_WL is erased and the adjacent word lines SEL_WL−1 and SEL_WL+1 are not erased, the operation control unit 240A and 240B may operate in such a manner that the given number of pages SEL_PGO and SEL_PGE included in the selected word line SEL_WL program the update data NEW_DATA<1:M> through a normal program operation (Normal Program), and the given number of pages SEL_PGO−1, SEL_PGE−1, SEL_PGO+1, and SEL_PGE+1 included in the adjacent word lines SEL_WL−1 and SEL_WL+1 program the backup data BU_DATA<1:M> through a reprogram operation (Re-Program), which is simpler than the normal program operation.

Since the program operation, the normal program operation, and the reprogram operation of the incremental pulse programming (ISPP) scheme are well-known technologies, a detailed description thereof will be omitted.

Among the plurality of word lines B<1:L>_WL<0:N>, a given number of word lines Bx_WL<0:N> divided by strings are grouped into one cell block BLOCK<x>, so that it is possible for the cell array 200 to include a plurality of cell blocks BLOCK<1:L>.

In the configuration in which the plurality of cell blocks BLOCK<1:L> are included in the cell array 200 and the given number of word lines Bx_WL<0:N> are included in each cell block as described above, the selection unit 220 selects one of the plurality of cell blocks BLOCK<1:L> in response to a block selection address BK_ADDR, thereby simultaneously selecting a given number of word lines B1_WL<0:N> included in the selected cell block SEL_BL, wherein the selection unit 220 may select one cell block by operating in such a manner that one signal of BSEL<1:L> is activated and remaining signals are deactivated. It is assumed that the first cell block BLOCK<1> is selected (SEL_BL) in the second embodiment of the present invention.

In this way, when the given number of word lines B1_WL<0:N> included in the selected cell block SEL_BL are simultaneously selected from the plurality of cell blocks BLOCK<1: L> in response to the block selection address BK_ADDR, the operation control unit 240A and 240B reads data of word lines B1_WL<0> and B1_WL<2:N>, except for data of a word line B1_WL<1> corresponding to the selected page SEL_PG among data of pages B1_PGO<0:N> and B1_PGE<0:N> included in the given number of pages B1_PGO<0:N> included in the selected cell block SEL_BL, in response to a block erase command BG_ERASE, outputs the read data as the backup data BU_DATA<1:M> simultaneously erases the pages B1_PGO<0:N> and B1_PGE<0:N> included in the given number of word lines B1_WL<0:N> included in the selected cell block SEL_BL, and reprograms the update data NEW_DATA<1:M> and the backup data BU_DATA<1:M> in the pages B1_PGO<0:N> and B1_PGE<0:N> included in the given number of pages B1_PGO<0:N> included in the selected cell block SEL_BL.

That is, the bias voltage providing section 240A supplies the read bias voltage VSEL<READ> to the word lines B1_WL<0> and B1_WL<2:N>, except for the word line B1_WL<1> corresponding to the selected page SEL_PG among the given number of word lines B1_WL<0:N> included in the selected cell block SEL_BL, at non-overlapping time points, simultaneously supplies the erase bias voltage VSEL<ERASE> to the given number of word lines B1_WL<0:N> included in the selected cell block SEL_BL, and supplies the program bias voltage VSEL<PROGRAM> to the given number of word lines B1_WL<0:N>, which are included in the selected cell block SEL_BL, at non-overlapping time points.

Furthermore, the page buffering section 240B reads data, which are stored in the pages B1_PGO<0>, B1_PGE<0>, B1_PGO<2:N> and B1_PGE<2:N> included in the word lines B1_WL<0> and B1_WL<2:N>, except for the word line B1_WL<1> corresponding to the selected page SEL_PG among the given number of word lines B1_WL<0:N> included in the selected cell block SEL_BL, in units of pages whenever the read bias voltage VSEL<READ> is supplied to the word lines B1_WL<0> and B1_WL<2:N>, except for the word line B1_WL<1> corresponding to the selected page SEL_PG among the given number of word lines B1_WL<0: N> included in the selected cell block SEL_BL, outputs the read data as the backup data BU_DATA<1:M>, receives the update data NEW_DATA<1:M> and the backup data BU_DATA<1:M> in units of pages whenever the program bias voltage VSEL<PROGRAM> is supplied to the given number of word lines B1_WL<0:N> included in the selected cell block SEL_BL, and programs the received data in the pages B1_PGO<0:N> and B1_PGE<0:N> included in the given number of word lines B1_WL<0:N> included in the selected cell block SEL_BL.

Although a detailed configuration of the data storage unit 260 is not directly illustrated, when the selection unit 220 selects one word line, it is possible to store, in units of pages, the data of the adjacent word lines SEL_WL−1 and SEL_WL+1. When the selection unit 220 selects one block, the data storage unit 260 includes a plurality of registers (not directly illustrated in FIG. 2) capable of storing, in units of pages, the data of the pages B1_PGO<0>, B1_PGE<0>, B1_PGO<2:N and B1_PGE<2:N> included in the word lines B1_WL<0> and B1_WL<2:N> except for the word line B1_WL<1> corresponding to the selected page SEL_PG among the given number of word lines B1_WL<0:N> included in the selected cell block SEL_BL.

Furthermore, the data storage unit 260 may have the plurality of registers as described above. The data storage unit 260 may have a plurality of latches (not illustrated in FIG. 2) capable of temporarily storing data through a logical circuit configuration, or may store the data in a given space (not illustrated in FIG. 2) of the cell array 200. At this time, since the given space of the cell array 200 generally indicates a space in which direct access is limited by a user, and a configuration of the nonvolatile memory device including the given space is well-known in the art, a detailed description thereof will be omitted.

Figure 3:
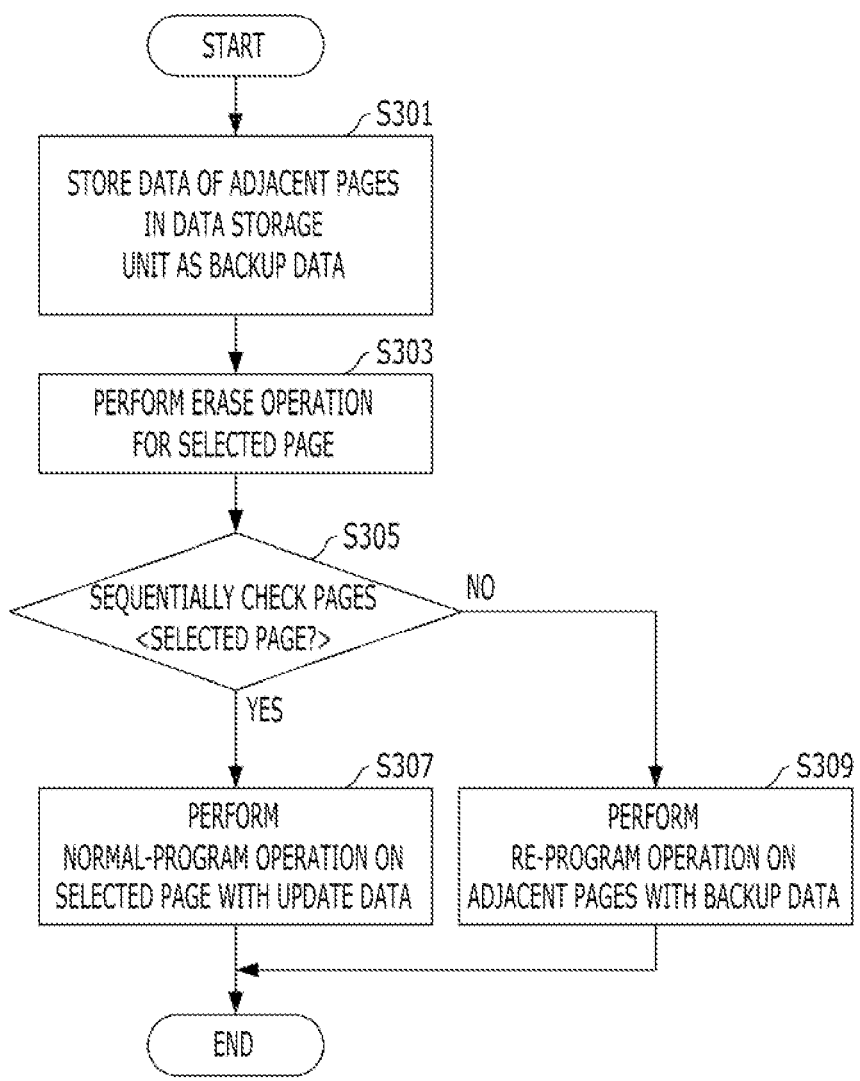
FIG. 3 is a flowchart illustrating operations of nonvolatile memory devices illustrated in FIGS. 1 and 2 in accordance with embodiments of the present invention.
Figure 4:
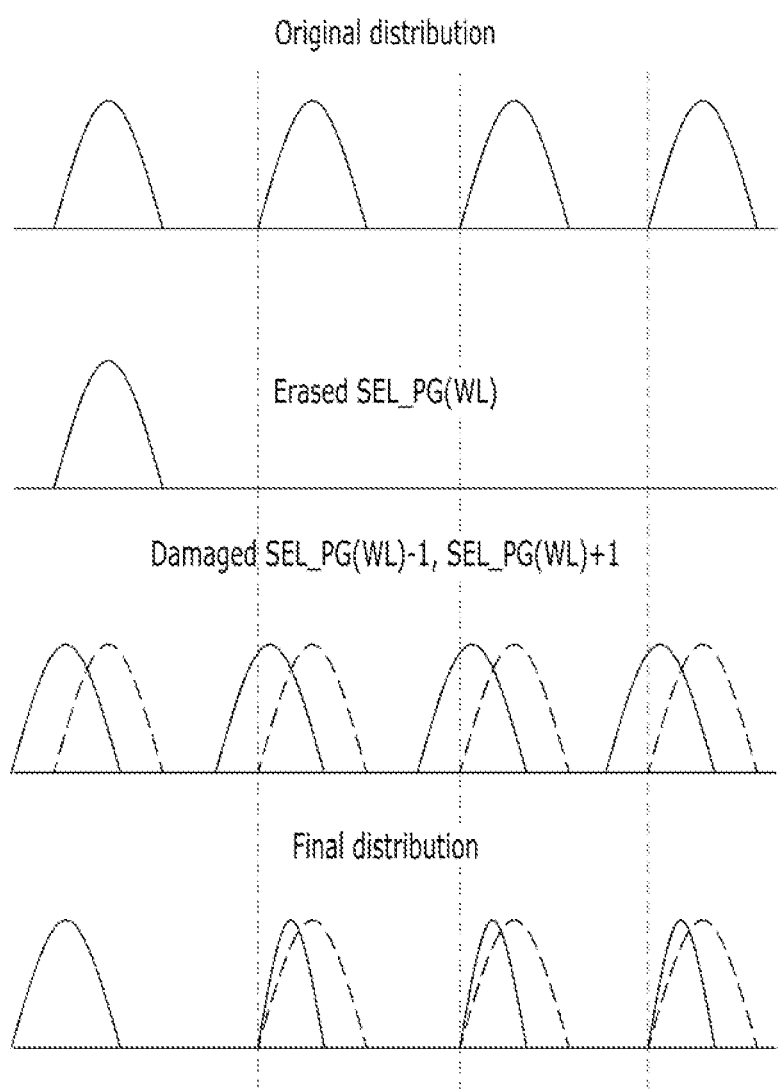
FIG. 4 is a diagram illustrating a change in cell distribution according to the operations of the nonvolatile memory devices.

FIG. 3 is a flowchart illustrating operations of nonvolatile memory devices illustrated in FIGS. 1 and 2 in accordance with the embodiments of the present invention, and FIG. 4 is a diagram illustrating a change in cell distribution according to the operations of the nonvolatile memory devices.

Referring to FIGS. 3 and 4, it may be understood that a cell distribution, which occurs before the operations of the nonvolatile memory devices in accordance with the first and second embodiments of the present invention are started, indicates cell distribution of a general nonvolatile memory device in which random data has been written.

Accordingly, the selected page SEL_PG selected by the selection unit 120 of the first embodiment and the adjacent pages SEL_PG−1, SEL_PG, and SEL_PG+1 are in a state "Original distribution" shown in FIG. 4 under the cell distribution of the general nonvolatile memory device in which random data has been written. Similarly, in the second embodiment, the given number of pages SEL_PGO−1, SEL_PGE−1, SEL_PGO, SEL_PGE, SEL_PGO+1, and SEL_PGE−1 corresponding to the selected word line SEL_WL and the adjacent word lines SEL_WL−1 and SEL_WL+1 are in the state Original distribution shown in FIG. 4 under the cell distribution of the general nonvolatile memory device in which random data has been written.

In such a state, in the first embodiment, the data stored in the adjacent pages SEL_PG−1 and SEL_PG+1 are backed up in the data storage unit 160 as the backup data BU_DATA<1: M> in response to the page erase command PG_ERASE. Similarly, in the second embodiment, the data stored in the given number of pages SEL_PGO−1, SEL_PGE−1, SEL_PGO+1, and SEL_PGE+1 corresponding to the adjacent word lines SEL_WL−1 and SEL_WL+1 is backed up in the data storage unit 260 as the backup data BU_DATA<1:M> in response to the page erase command PG_ERASE. (see S301 of FIG. 3)

Then, in the first embodiment, the data of the selected page SEL_PG is erased and cell distribution thereof is initialized, i.e., "Erased SEL_PG" as shown in FIG. 4. (see S303 of FIG. 3) However, even though the data of the adjacent pages SEL_PG−1 and SEL_PG+1 are not directly erased, cell distribution thereof is damaged, i.e., "Damaged SEL_PG−1 and SEL_PG+1" shown in FIG. 4, due to interference. Similarly, in the second embodiment, the data of the given number of pages SEL_PGO and SEL_PGE included in the selected word line SEL_WL is erased and cell distribution thereof is initialized, i.e., "Erased SEL_PG" shown in FIG. 4. (see S303 of FIG. 3) However, even though the data of the given number of pages SEL_PGO−1, SEL_PGE−1, SEL_PGO+1, and SEL_PGE+1 included in the adjacent word lines SEL_WL−1 and SEL_WL+1 is not directly erased, cell distribution thereof is damaged, i.e., "Damaged SEL_WL−1 and SEL_WL+1" shown in FIG. 4, due to interference.

In this way, in the first embodiment, after all the data of the selected page SEL_PG is erased, the update data NEW_DATA<1:M> is received and programmed in the selected page SEL_PG, and the backup data BU_DATA<1:M> stored in the data storage unit 160 is received and programmed in the adjacent pages SEL_PG−1 and SEL_PG+1. At this time, when performing a program operation of programming the update data NEW_DATA<1:M> in the selected page SEL_PG, the normal program NORMAL-PROGRAM operation is performed (see S305 and S307 of FIG. 3). When performing a program operation of programming the backup data BU_DATA<1:M> in the adjacent pages SEL_PG−1 and SEL_PG+1, the reprogram RE-PROGRAM operation is performed. (see S305 and S309 of FIG. 3) Accordingly, the selected page SEL_PG and the adjacent pages SEL_PG−1 and SEL_PG+1 return again to a state "Final distribution" shown in FIG. 4 under the cell distribution of the general nonvolatile memory device in which random data has been written.

Similarly, in the second embodiment, after all the data of the selected word line SEL_WL is erased, the update data NEW_DATA<1:M> is programmed in the given number of pages SEL_PGO and SEL_PGE included in the selected word line SEL_WL, and the backup data BU_DATA<1:M> stored in the data storage unit 260 is received and programmed in the given number of pages SEL_PGO−1, SEL_PGE−1, SEL_PGO+1, and SEL_PGE+1 included in the adjacent word lines SEL_WL−1 and SEL_WL+1. At this time, when performing a program operation of programming the update data NEW_DATA<1:M> in the given number of pages SEL_PGO and SEL_PGE included in the selected word line SEL_WL, the normal program NORMAL-PROGRAM operation is performed as shown in S305 and S307 of FIG. 3. When performing a program operation of programming the backup data BU_DATA<1:M> in the given number of pages SEL_PGO−1, SEL_PGE−1, SEL_PGO+1, and SEL_PGE+1 included in the adjacent word lines SEL_WL−1 and SEL_WL+1, the reprogram RE-PROGRAM operation is performed as shown in S305 and S309 of FIG. 3. Accordingly, the given number of pages SEL_PGO−1, SEL_PGE−1, SEL_PGO+1, SEL_PGO, SEL_PGE, and SEL_PGE+1 corresponding to the selected word line SEL_WL and the adjacent word lines SEL_WL−1 and SEL_WL+1 return again to the state "Final distribution" having the cell distribution of the general nonvolatile memory device in which random data has been written.

Figure 5:
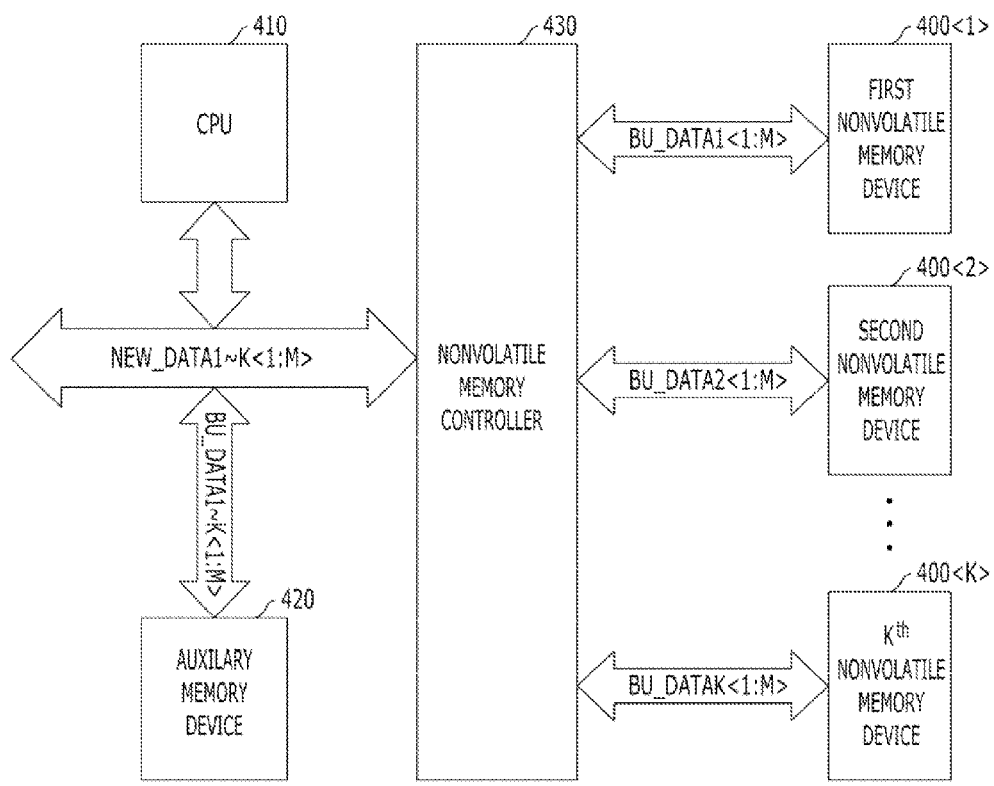
FIG. 5 is a block diagram illustrating a nonvolatile memory system in accordance with third embodiment of the present invention.

FIG. 5 is a block diagram illustrating a nonvolatile memory system in accordance with an embodiment of the present invention.

Referring to FIG. 5, the nonvolatile memory system in accordance with the embodiment of the present invention has a configuration in which the data storage units 160 and 260 of the first and second embodiments of the present invention described in FIGS. 1 to 5 are provided to an exterior of the nonvolatile memory devices as an auxiliary memory device 420. Accordingly, the nonvolatile memory devices 400<1:K> included in the nonvolatile memory system illustrated in FIG. 5 support an erase operation in units of pages similarly to the nonvolatile memory devices in accordance with the first and second embodiments of the present invention described in FIGS. 1 to 4.

In detail, the nonvolatile memory system in accordance with the embodiment of the present invention includes the nonvolatile memory devices 400<1:K> and the auxiliary memory device 420. The nonvolatile memory devices 400<1:K> are configured to support the erase operation in units of pages, to output data of a given number of pages SEL_PG−1 and SEL_PG+1, which are adjacent to a selected page SEL_PG to be erased, as backup data BU_DATA1<1:M> to BU_DATAK<1:M> in response to the page erase command PG_ERASE, to perform the erase operation for the selected page SEL_PG to be erased, and to reprogram update data NEW_DATA1<1:M> to NEW_DATAK<1:M> and the backup data BU_DATA1<1:M> to BU_DATAK<1:M> in the selected page SEL_PG to be erased and the given number of pages SEL_PG−1 and SEL_PG+1 adjacent to the page SEL_PG to be erased. The auxiliary memory device 420 is configured to store the backup data BU_DATA1<1:M> to BU_DATAK<1:M> which are output from the nonvolatile memory devices 400<1:K>.

A detailed configuration of the nonvolatile memory devices 400<1:K> may be divided into two cases. That is, it may be possible to provide a first configuration of the nonvolatile memory devices 400<1:K> corresponding to the first embodiment of the present invention and a second configuration of the nonvolatile memory devices 400<1:K> corresponding to the second embodiment of the present invention.

Accordingly, since it is possible to understand the first configuration of the nonvolatile memory devices 400<1:K> corresponding to the first embodiment of the present invention with reference to FIG. 1 and a detailed description thereof has been disclosed herein, a redundant description will be omitted.

Here, each of the nonvolatile memory devices 400<1:K> corresponding to the first embodiment of the present invention described in FIG. 1 includes the data storage unit 160. However, since the nonvolatile memory system in accordance with the embodiment of the present invention illustrated in FIG. 5 includes the auxiliary memory device 420 separately from the nonvolatile memory devices 400<1:K>, the data storage unit 160 need not be included in each of the nonvolatile memory devices 400<1:K>.

That is, in the nonvolatile memory system illustrated in FIG. 5, each of the nonvolatile memory devices 400<1:K> includes the cell array 100, the selection unit 120, and the operation control 140A and 140B among the elements of the nonvolatile memory device in accordance with the first embodiment of the present invention illustrated in FIG. 1, and does not include the data storage unit 160. Instead, the nonvolatile memory system has a configuration in which the backup data BU_DATA1<1:M> to BU_DATAK<1:M> are outputted to an exterior of the nonvolatile memory devices 400<1:K> and then are stored in the auxiliary memory device 420.

Accordingly, the auxiliary memory device 420 illustrated in FIG. 5 has a configuration including a plurality of memory cells capable of storing, in units of pages, the data of the adjacent pages SEL_PG−1 and SEL_PG+1.

Furthermore, the auxiliary memory device 420 may have a volatile memory device having a fast data input/output speed.

Similarly, since it is possible to understand the first configuration of the nonvolatile memory devices 400<1:K> corresponding to the second embodiment of the present invention with reference to FIG. 2 and a detailed description thereof has been disclosed herein, a redundant description will be omitted.

Here, each of the nonvolatile memory devices 400<1:K> corresponding to the second embodiment of the present invention described in FIG. 2 includes the data storage unit 260. However, since the nonvolatile memory system illustrated in FIG. 5 includes the auxiliary memory device 420 separately from the nonvolatile memory devices 400<1:K>, the data storage unit 260 need not to be included in each of the nonvolatile memory devices 400<1:K>.

That is, in the nonvolatile memory system illustrated in FIG. 5, each of the nonvolatile memory devices 400<1:K> includes the cell array 200, the selection unit 220, and the operation control 240A and 240B among the elements of the nonvolatile memory device in accordance with the second embodiment of the present invention illustrated in FIG. 2, and does not include the data storage unit 260. Instead, the nonvolatile memory system has a configuration in which the backup data BU_DATA1<1:M> to BU_DATAK<1:M> are output to an exterior of the nonvolatile memory devices 400<1:K>, and then are stored in the auxiliary memory device 420.

Accordingly, the auxiliary memory device 420 illustrated in FIG. 5 has a configuration including a plurality of memory cells capable of storing, in units of pages, the data of the given number of pages SEL_PGO−1, SEL_PGE−1, SEL_PGO+1, and SEL_PGE+1 corresponding to the adjacent word lines SEL_WL−1 and SEL_WL+1.

Furthermore, the auxiliary memory device 420 may have a volatile memory device having a fast data input/output speed.

The nonvolatile memory devices 400<1:K> illustrated in FIG. 5 support an erase operation in units of blocks as well as the erase operation in units of pages similarly to the nonvolatile memory devices in accordance with the first and second embodiment of the present invention. That is, each of the nonvolatile memory devices 400<1:K> outputs data of pages, except for the selected page SEL_PG to be erased of data of a block SEL_BL to be erased, as the backup data BU_DATA1<1:M> to BU_DATAK<1:M> in response to a block erase come and BG_ERASE, performs an erase operation for the block SEL_BL to be erased, and reprograms the update data NEW_DATA1<1:M> to NEW_DATAK<1:M> and the backup data BU_DATA1<1:M> to BU_DATAK<1:M> in the block SEL_BL to be erased.

Furthermore, it can be understood that the number of the nonvolatile memory devices 400<1:K> illustrated in FIG. 5 is "K". Since this is for illustrative purposes to show that the plurality of nonvolatile memory devices 400<1:K> are included in the nonvolatile memory system and may operate in a parallel manner, the operation of each of the nonvolatile memory devices 400<1:K> is substantially equal to those of the nonvolatile memory devices in accordance with the first and second embodiment of the present invention.

Furthermore, the nonvolatile memory system illustrated in FIG. 5 further includes a nonvolatile memory controller 430 provided between the nonvolatile memory devices 400<1:K> and the auxiliary memory device 420. In detail, the nonvolatile memory controller 430 may be controlled by a CPU, and performs operations of providing the nonvolatile memory devices 400<1:K> with command signals, such as the page erase command PG_ERASE and the block erase command BG_ERASE, to control the operations of the nonvolatile memory devices 400<1:K> transferring update data NEW_DATA1<1:M> to NEW_DATAK<1:M> which are input from an exterior to the nonvolatile memory devices 400<1:K>, and storing the backup data BU_DATA1<1:M> to BU_DATAK<1:M> which are output from the nonvolatile memory devices 400<1:K> in the auxiliary memory device 420.

As described above, when applying the embodiments of the present invention, the aforementioned embodiments of the present invention allow the erase operation to be performed in the nonvolatile memory device in units of pages as well as in units of blocks. Therefore, the embodiments of the present invention may significantly increase the use expandability and efficiency of the nonvolatile memory device.

Furthermore, when the erase operation is performed in the nonvolatile memory device in units of pages, a scheme is used to store a page adjacent to a page to be erased in a separate storage space and to reprogram the stored page later, so that it may be possible to substantially prevent interference from occurring in the page adjacent to the page to be erased, and thus, to significantly improve the performance of the nonvolatile memory device.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
   a cell array including a plurality of pages;
   a selection unit configured to select one of the pages in response to a page selection address;
   an operation control unit configured to read data of a given number of pages adjacent to the selected page and output the read data as backup data, to erase data of the selected page, in response to a page erase command, and to reprogram update data and the backup data in the selected page and the adjacent pages, respectively; and
   a data storage unit configured to store the backup data.

2. The nonvolatile memory device of claim 1, wherein the operation control unit comprises:
   a bias voltage providing section configured to sequentially supply an erase bias voltage and a program bias voltage to a word line corresponding to the selected page, and to sequentially supply a read bias voltage and the program bias voltage to a given number of word lines corresponding to the adjacent pages, in response to the page erase command; and
   a page buffering section configured to read data in a period, in which the read bias voltage is provided to the adjacent pages, in units of pages, to output the read data as the backup data, and to receive and program the update data and the backup data in units of pages in a period in which the program bias voltage is provided to the selected page and the adjacent pages.

3. The nonvolatile memory device of claim 2, wherein the bias voltage providing section is configured to supply the read bias voltage to the given number of word lines corresponding to the adjacent pages at non-overlapping time points, to supply the erase bias voltage to the word line corresponding to the selected page, and to supply the program bias voltage to the word line corresponding to the selected page and the given number of word lines corresponding to the adjacent pages at non-overlapping time points.

4. The nonvolatile memory device of claim 2, wherein the page buffering section is configured to read data in units of pages, which are stored in the adjacent pages when the read bias voltage is supplied to the given number of word lines corresponding to the adjacent pages, and output the read data as the backup data, and configured to receive the update data and the backup data in units of pages when the program bias voltage is supplied to the word line corresponding to the selected page and the given number of word lines corresponding to the adjacent pages and program the received data in the pages.

5. The nonvolatile memory device of claim 1, wherein the cell array comprises a plurality of cell blocks, each cell block including a given number of pages divided by strings.

6. The nonvolatile memory device of claim 5, wherein the selection unit is configured to select one of the cell blocks in response to a block selection address so as to simultaneously select a given number of pages included in the selected cell block.

7. The nonvolatile memory device of claim 6, wherein the operation control unit is configured to read data of pages, except for the selected page among the given number of pages included in the selected cell block, in response to a block erase command, to output the read data as the backup data, to simultaneously erase the given number of pages included in the selected cell block, and to reprogram the update data and the backup data in the given number of pages included in the selected cell block.

8. The nonvolatile memory device of claim 7, wherein the data storage unit comprises:
a plurality of registers configured to store data of the adjacent pages, or data of pages except for the selected page among the given number of pages included in the selected cell block, in units of pages.

9. The nonvolatile memory device of claim 1, wherein the update data is input from an exterior in units of pages and is newly programmed in the selected page.

10. A nonvolatile memory device comprising:
a cell array including a plurality of word lines, each constituting a given number of pages;
a selection unit configured to select one of the word lines, which includes a page selected in response to a page selection address;
an operation control unit configured to read data of a given number of word lines adjacent to the selected word line and output the read data as backup data, to erase data of the selected word line, in response to a page erase command, and to reprogram update data and the backup data in the selected word line and the adjacent word lines, respectively; and
a data storage unit configured to store the backup data.

11. The nonvolatile memory device of claim 10, wherein the operation control unit comprises:
a bias voltage providing section configured to sequentially supply an erase bias voltage and a program bias voltage to the selected word line, and to sequentially supply a read bias voltage and the program bias voltage to the adjacent word lines, in response to the page erase command; and
a page buffering section configured to read data in a period, in which the read bias voltage is provided to a given number of pages included in the adjacent word lines, in units of pages, to output the read data as the backup data, and to receive and program the update data and the backup data in units of pages in a period in which the program bias voltage is provided to the selected word line and the given number of pages included in the adjacent word lines.

12. The nonvolatile memory device of claim 11, wherein the bias voltage providing section is configured to supply the read bias voltage to the adjacent word lines at non-overlapping time points, to supply the erase bias voltage to the selected word line, and to supply the program bias voltage to the selected word line and the adjacent word lines at non-overlapping time points.

13. The nonvolatile memory device of claim 11, wherein the page buffering section is configured to read data in units of pages, which are stored in the given number of pages included in the adjacent word lines when the read bias voltage is supplied to the adjacent word lines, and output the read data as the backup data, to receive the update data and the backup data in units of pages when the program bias voltage is supplied to the selected word line and the adjacent word lines, and to program the received data in the given number of pages included in the word lines.

14. The nonvolatile memory device of claim 10, wherein the cell array comprises a plurality of cell blocks, each cell block including a given number of pages divided by strings.

15. The nonvolatile memory device of claim 14, wherein the selection unit is configured to select one of the plurality of cell blocks in response to a block selection address so as to simultaneously select a given number of word lines included in the selected cell block.

16. The nonvolatile memory device of claim 15, wherein the operation control unit is configured to read data of word lines, except for the selected word line among the given number of word lines included in the selected cell block, in response to a block erase command, to output the read data as the backup data, to simultaneously erase the given number of word lines included in the selected cell block, and to reprogram the update data and the backup data in the given number of word lines included in the selected cell block.

17. The nonvolatile memory device of claim 16, wherein the data storage unit comprises:
a plurality of registers configured to store data of the adjacent word lines, or data of word lines, except for the selected word line among the given number of word lines included in the selected cell block, in units of pages.

18. The nonvolatile memory device of claim 10, wherein the update data is input from an exterior in units of pages and is newly programmed in the selected word line.

19. A nonvolatile memory system comprising:
a nonvolatile memory device configured to support an erase operation in units of pages, to output data of a given number of pages adjacent to a selected page to be erased as backup data in response to a page erase command, to perform the erase operation for the selected page, and to reprogram update data and the backup data in the selected page and the adjacent pages, respectively; and
an auxiliary memory device configured to store the backup data.

20. The nonvolatile memory system of claim 19, wherein the nonvolatile memory device comprises:
a cell array including a plurality of pages;
a selection unit configured to select one of the plurality of pages as the selected page in response to a page selection address;
a bias voltage providing section configured to sequentially supply an erase bias voltage and a program bias voltage to a word line corresponding to the selected page, and to sequentially supply a read bias voltage and the program bias voltage to a given number of word lines corresponding to the adjacent pages, in response to the page erase command; and
a page buffering section configured to read data in a period, in which the read bias voltage is provided to the adjacent pages, in units of pages, to output the read data as the backup data, and to receive and program the update data and the backup data in units of pages in a period in which the program bias voltage is provided to the selected page and the adjacent pages.

21. The nonvolatile memory system of claim 20, wherein the auxiliary memory device comprises:
    a plurality of memory cells configured to store data of the adjacent pages adjacent to the selected page in units of pages.

22. The nonvolatile memory system of claim 19, wherein the nonvolatile memory device comprises:
    a cell array including a plurality of word lines, each constituting a given number of pages;
    a selection unit configured to select one of the word lines, which includes the selected page in response to a page selection address;
    a bias voltage providing section configured to sequentially supply an erase bias voltage and a program bias voltage to the selected word line, and to sequentially supply a read bias voltage and the program bias voltage to a given number of word lines adjacent to the selected word line, in response to the page erase command; and
    a page buffering section configured to read data in a period, in which the read bias voltage is provided to the adjacent word lines, in units of pages, to output the read data as the backup data, and to receive and program the update data and the backup data in units of pages in a period in which the program bias voltage is provided to the selected word line and the adjacent word lines.

23. The nonvolatile memory system of claim 22, wherein the auxiliary memory device comprises:
    a plurality of memory cells configured to store data of the adjacent word lines in units of pages.

24. The nonvolatile memory system of claim 19, wherein the nonvolatile memory device is configured to support an erase operation in units of blocks, to output data, except for data of the selected page, among data of a block to be erased as the backup data in response to a block erase command, to perform the erase operation for the block to be erased, and to reprogram the update data and the backup data in the block to be erased.

25. The nonvolatile memory system of claim 19, wherein the update data is input to the nonvolatile memory device through a controller in units of pages and is newly programmed in the page to be erased.

\* \* \* \* \*